United States Patent [19]

Cooper, Jr.

[11] Patent Number: 4,635,083

[45] Date of Patent: Jan. 6, 1987

[54] MEMORY DEVICE

[75] Inventor: James A. Cooper, Jr., West Lafayette, Ind.

[73] Assignee: Purdue Research Foundation, West Lafayette, Ind.

[21] Appl. No.: 851,273

[22] Filed: Apr. 10, 1986

Related U.S. Application Data

[63] Continuation of Ser. No. 609,447, May 11, 1984, abandoned.

[51] Int. Cl.[4] ............... H01L 29/161; H01L 29/78
[52] U.S. Cl. ........................... 357/16; 357/24; 357/23.2; 357/23.6; 357/23.14
[58] Field of Search ............... 357/24 LR, 16, 23.2, 357/23.6, 23.14, 23.15

[56] References Cited

U.S. PATENT DOCUMENTS

| | | | |
|---|---|---|---|
| 4,257,057 | 3/1981 | Cheung | 357/16 X |
| 4,424,525 | 1/1984 | Mimura | 357/15 X |
| 4,433,343 | 2/1984 | Levine | 357/24 LR |

*Primary Examiner*—Martin H. Edlow
*Attorney, Agent, or Firm*—Barnes & Thornburg

[57] ABSTRACT

A memory device includes a relative lower bandgap energy first semiconductor layer, a relatively higher bandgap energy second semiconductor layer on the first, an alloy source rectifying to the first layer, a well for storing charge and a gate for controlling charge flow between the source and the well. The gate is formed on the second layer, as is a field plate for controlling the storage charge in the well. In one embodiment, a buried channel field effect transistor is combined with the basic memory device, with the charge content of the well controlling current flow between the source and drain of the buried channel FET.

10 Claims, 3 Drawing Figures

MEMORY DEVICE

This application is a continuation of Ser. No. 609,447, filed 5/11/84, now abandoned.

This invention relates to solid state memory devices and particularly to a new type of memory cell utilizing high electron mobility transistor (HEMT) technology.

So-called high electron mobility transistors are known. HEMT devices are analogous to MOS devices, with the main difference being that HEMT devices confine the carriers (typically electrons) at the interface between two semiconductor layers having slightly different bandgap energies, whereas in MOS devices the carriers are confined at the interface between the semiconductor and an insulating layer. Thus, whereas the potential barrier in an MOS device is around 6 eV, the equivalent barrier in the HEMT device is around 0.3 eV. HEMT structures, then, may be considered MSS devices, characterized by a heterojunction between the two semiconductor layers, rather than the absence of a junction which occurs between the oxide and semiconductor layers of a MOS device.

In the MOS technology, dynamic random access memory (RAM) cells are known. In particular, one-transistor dynamic RAM cells are important components of many digital integrated circuits. Most dynamic RAM cells can only be read by placing the stored charge directly on the readout lines. This destroys the information in the cell. In addition, the signal on the readout lines is very weak, requiring elaborate detection circuits. One way around this problem is to use a RAM cell which has non-destructive readout (NDRO). One class of NDRO RAM cells for the MOS technology was proposed by D. M. Erb in "Stratified Charge RAM Cell", 1978 ISSCC. In this cell, the signal charge was held in a surface potential well, and a buried channel was used for non-destructive readout. The buried channel proposed by this reference was to be formed by non-uniform channel doping.

According to the invention, a memory device comprises a relatively lower bandgap energy first layer, a relatively higher bandgap energy second layer on the first, an alloy source for charge carriers, the source located in the first layer and rectifying to the first layer, a well for storing charge, with the charge content of the well to be read out, and a gate electrode for controlling charge flow between the source and the well, the gate being formed on the second layer.

Further according to the invention, a memory device comprises a relatively lower bandgap energy first semiconductor layer, a relatively higher bandgap energy second semiconductor layer on the first, a source for charge carriers, with the source located in the first layer and rectifying to the first layer, a well for storing charge, the charge content of the well to be readout, and the gate electrode for controlling charge flow between the source and the well, with the gate formed on the second layer.

According to yet another aspect of the invention, a memory device, such as an imaging device, comprises a relatively lower bandgap energy first semiconductor layer, a relatively higher bandgap energy second semiconductor layer on the first and a well formed at the heterojunction for storing photogenerated minority carriers.

According to illustrative embodiments of the invention, the source includes means providing an external electrode, the gate includes means providing an external electrode, and the gate is located with respect to the source and the well so as to control charge flow between the source and the well. The device further comprises a field plate for retaining the stored charge in the well.

According to illustrative embodiments, the first layer comprises P-type gallium arsenide. According to one illustrative embodiment, the second layer comprises aluminum arsenide. Illustratively, the aluminum arsenide is N-type.

According to yet another embodiment, the second layer comprises aluminum gallium arsenide. Again, illustratively, the aluminum gallium arsenide is N-type. According to one illustrative embodiment, the second layer comprises $Al_{0.3}Ga_{0.7}As$.

According to illustrative embodiments, the memory device comprises a third intrinsic layer between the first and second layers.

According to another aspect of the invention, the memory device comprises a buried channel field effect transistor for readout of the well charge content. The field effect transistor is located adjacent the memory device. Illustratively, the field effect transistor comprises a second source and a drain. The second source includes an external electrode, the drain comprises an external electrode, and the well is positioned with respect to the second source and drain so as to control current flow between the second source and drain.

According to illustrative embodiments of the invention, the gate electrode and field plate are formed on a side of the second layer opposite the side on which the first layer resides.

In the buried channel field effect transistor embodiment, the gate electrode, the field plate, the second source electrode and the drain electrode illustratively are formed on the side of the second layer opposite the side on which the first layer resides.

According to illustrative embodiments, the first layer is provided by a substrate. According to other embodiments, a substrate is provided from a material which prevents majority carrier flow between the first layer and the substrate. The substrate thus can be of a relatively more insulative material than the first layer, or the substrate can be N-type if the first layer is P-type, or the substrate can be P-type if the first layer is N-type. Alternatively, the substrate can be of the same type, but have a higher bandgap energy than the bandgap energy of the first layer. Any of these alternatives prevent majority carrier flow between the first layer and substrate. In any of these situations, the first layer is provided on the substrate and includes the buried channel of the field effect transistor, and the second layer is formed on the first. Current flow through the buried channel is controlled by the amount of charge in the well.

The invention may best be understood by referring to the following description and accompanying drawings which illustrate the invention. In the drawings.

Figure 1:
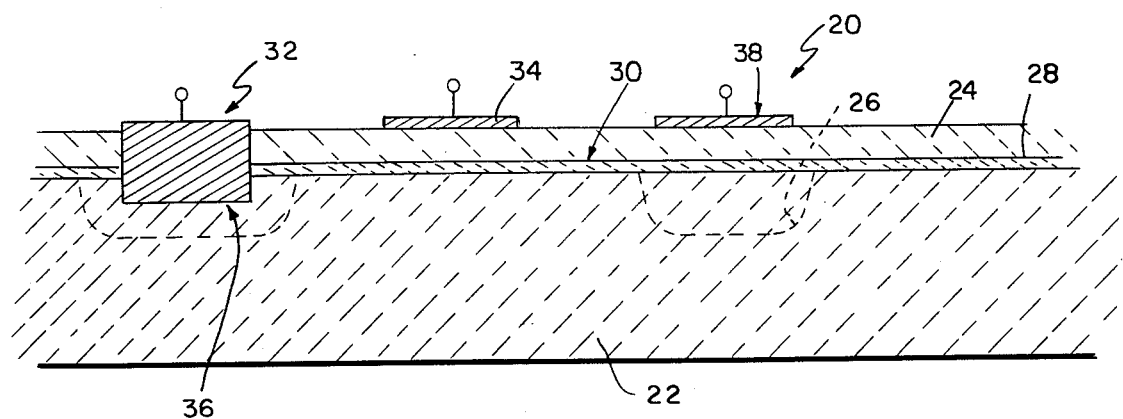
FIG. 1 is a sectional view through a memory device constructed according to the present invention.

Referring now specifically to FIG. 1, a memory device 20 comprises a first layer 22 of a semiconductor material having a relatively lower bandgap energy. The material from which layer 22 of FIG. 1 was constructed was P-type GaAs. A relatively higher bandgap energy second semiconducter layer 24 was grown on the first layer. For a dynamic RAM, semiconductor layer 24 could be AlAs or AlGaAs. These materials have sufficiently high bandgap energies to prevent minority carriers located in wells 26 in the underlying first layer from migrating back across the heterojunction 28 formed between the first and second layers 22, 24, respectively, and destroying the information stored in the memory cell. A material having a suitably high bandgap energy for use as a second layer 24 of a quasi-static RAM is $Al_{0.3}Ga_{0.7}As$. The material from which layer 24 is constructed can be doped oppositely to the material from which layer 22 is constructed, that is, N-type if layer 22 is P-type, and vice versa. The material from which layer 24 is constructed could also be intrinsic. Alternatively, an intrinsic third layer 30 of much narrower dimensions (e.g., 100Å) can be interposed between the first and second layers 22, 24. Illustratively, the third layer 30 comprises an undoped AlAs or AlGaAs crystalline layer.

The memory device 20 includes a source 32 of charge carriers. Source 32 is constructed from an alloy which forms a rectifying junction 36 with the material of the first layer 22. This rectifying junction is a source of minority carriers for transport to, storage in, and readout from, the well 26. The material from which source 32 is formed can be, for example, gold-germanium-nickel/silver/gold. Device 20 also includes a transfer gate electrode metallization 34 of, for example, aluminum. Electrode 34 is positioned between the junction 36 and the well 26 in order to control charge flow back and forth between the source 32 and the well 26. The gate 34 metallization is formed on the top of layer 24, that is, on the side of layer 24 opposite layer 22.

A field plate metallization 38 is provided over the region defining the well 26. The metallization 38 defines the well 26 region. Applying a potential across the well 38 metallization-to-layer 22 permits charge to be stored in the well region 26.

In this structure, it is possible to store charge in a quasi-static fashion by isolating minority carriers (electrons in the P-type material from which layer 22 is constructed) at the high bandgap energy material-low bandgap energy material heterojunction, such as the AlGaAs-GaAs heterojunction. The memory device thus constructed functions as a dynamic RAM at room temperature, since the charge leaks over the heterojunction barrier in a time on the order of a few milliseconds at 300° K. Calculations indicate that at 77° K., the storage time for charge in the well 26 is on the order of one day, assuming the high bandgap energy material is of the stoichiometric formula $Al_{0.3}Ga_{0.7}As$.

If the heterojunction is formed between AlAs and GaAs, the bandgap energy differential between these two materials is about 0.6 eV. In a heterojunction device using these materials, the storage times become around one minute at 300° K. and around $10^{24}$ years at 77° K. Thermal generation (or dark current) is also suppressed at 77° K., and in any event, the thermal minority carrier generation rate will be much lower than the emission rate over the heterojunction barrier if the heterojunction energy gap differential is on the order of 0.6 eV.

The structure includes alloy contact source 32, which is rectifying (36) to the P-type first layer 22, storage well 26 and transfer gate 34. Source 32 can supply and extract minority carriers (in this case, electrons) from the storage well 26 under the control of transfer gate 34, which controls the flow of electrons between the source 32 and the storage well 26. In operation, the field plate 38 associated with storage well 26 is maintained at a positive potential and electrons are admitted to well 26 if the gate electrode 34 goes positive while the alloy source 32 remains near ground (all potentials noted relative to the potential of the first layer 22, which may be a substrate). Electrons can be extracted from the well 26 and hence detected if the field plate 38 is positive, and at the same time the transfer plate 34 and the alloy source contact 32 both go more positive than the field plate 38. This readout process is destructive, that is, the electrons escape from the well 26. Thus, the process requires the subsequent programming of the memory device 20. Moreover, since a relatively few electrons are actually stored at any one time in the well 26, detectability becomes a problem as the well 26 dimensions are reduced. This device thus can best be described as a dynamic RAM.

Figure 2:
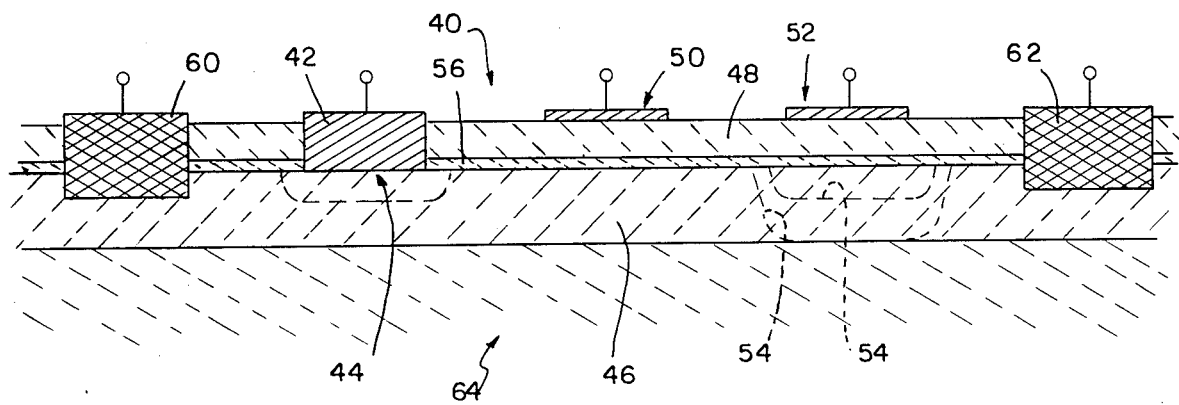
FIG. 2 is a sectional view through a memory device constructed according to the present invention and incorporating a buried channel FET.

In line with the effort to provide a quasi-static or static RAM, a memory device incorporating the principles illustrated in FIG. 1, but having a non-destructive readout (NDRO) is provided. Such a NDRO scheme can be achieved with the device of FIG. 2. In the device of FIG. 2, the basic memory device of FIG. 1 remains. That is, the device 40 of FIG. 2 includes an alloy source 42 having a rectifying junction 44 to a first layer 46. A second layer 48 overlies the first layer 46 and includes a transfer gate electrode 50 and a field plate 52 overlying a well region 54 of variable size depending upon the number of minority carriers stored in the well region 54. Illustratively, region 46 again is P-type GaAs, and region 48 is intrinsic or slightly N-type AlAs or AlGaAs. In accordance with the convention in HEMT devices, if layer 48 is doped oppositely to layer 46, an intervening intrinsic layer 56 of relatively less thickness, on the order of 100Å or so, of AlAs or AlGaAs can be employed.

In the embodiment of FIG. 2, the first layer 46 forms the buried channel of a field effect transistor. The transistor also includes an alloy second source 60 and an alloy drain 62. In this device 40, layer 46 is formed upon a substrate 64 of a material that prevents majority carrier flow between the first layer 46 and the substrate 64. The effect of the well 54 in controlling current flow between the source 60 and drain 62 is not compromised in this structure. This forms a NDRO memory device in that the charge is stored in the well 54 in the same manner as with the device of FIG. 1. However, readout from the memory device 40 does not affect the charge content of the well 54. Rather, the charge content of the well 54, which remains constant throughout readout, determines whether or not current flows between the source 60 and drain 62. If current does flow, it is an indication that the channel beneath the well 54 is not pinched off, and a first well 54 charge content is assumed. If current does not flow between source 60 and drain 62, it is an indication of a second charge content in well 54. In a digital memory, the presence of current flow between the source 60 and drain 62 will indicate one memory cell state (e.g., "0") and the absence of current flow between source 60 and drain 62 will indicate the other memory cell state (e.g., "1").

The substrate 64 can be constructed from any of a number of different materials, as long as majority carrier flow between the substrate 64 and the layer 46 is prevented. Thus, the substrate 64 can be an insulative material, or it can be of an opposite majority carrier type to the majority carrier type of the layer 46, e.g., if layer 46 is P-type, layer 64 should be N-type. Alternatively, layer 64 can be of such a material that a high bandgap energy differential exists between the material from which substrate 64 is constructed and the material from which layer 46 is constructed.

Figure 3:
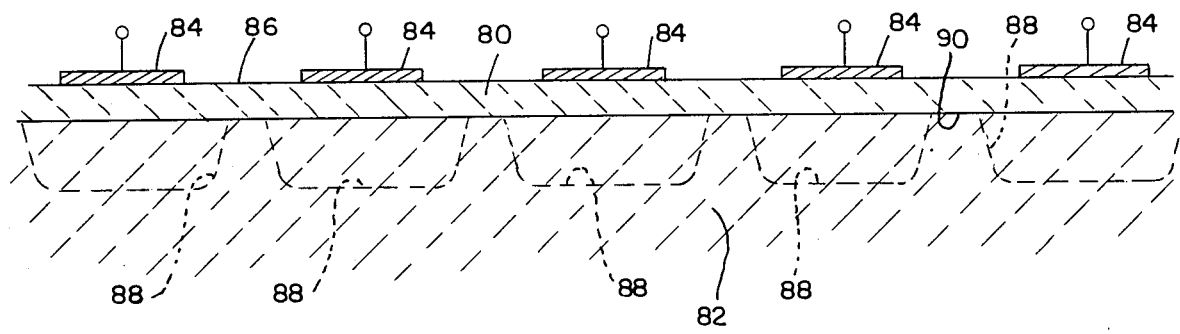
FIG. 3 is a sectional view through several memory cells of an imaging device constructed according to the present invention.

The structure illustrated in FIG. 3 is a portion of a type of memory device useful as an imaging device, and relies upon photogeneration of minority carriers. Basically, the mechanism employed in the imaging device of FIG. 3 involves the generation of photoelectrons as a result of photons selectively striking areas of the first layer 82, which illustratively is P-type GaAs. The number of photons striking any given area is based upon the portion of the image to be stored in that area. Small field plate metallizations 84 provided on the surface 86 of second layer 80, and maintained at positive potential with respect to first layer 82, determine the locations of the potential wells 88 where quantities of charge proportional to the number of photons striking these various areas are stored at heterojunction 90 beneath respective field plates 84. Schemes such as those illustrated in FIG. 1 (dynamic or quasi-static RAM), in which the readout from the potential wells 80 is destructive, or the scheme illustrated in FIG. 2. (static RAM) in which the readout is by way of current flow between the source and drain of a buried channel FET and is non-destructive, can be employed in an imaging device of the type illustrated in FIG. 3.

What is claimed is:

1. A memory cell comprising a first semiconductor layer, a second semiconductor layer, the second layer having a side adjacent the first layer and an opposite side, a barrier between the first and second layers preventing the migration of minority carriers from the first layer to the second layer, a source of minority carriers in the first layer, and means for providing a transfer terminal and a storage terminal on the opposite side of the second layer, the storage terminal determining the location of a potential well in the first layer adjacent the barrier, the well adapted for storing minority carriers from the first layer, the presence or absence of a substantial number of minority carriers in the well determining the state of the cell, the transfer terminal controlling the flow of minority carriers between the source of minority carriers and the well.

2. The memory cell of claim 1 wherein the barrier comprises a heterojunction between the first layer and the second layer.

3. The memory cell of claim 1 wherein the source of minority carriers in the first layer comprises means providing a rectifying junction in the first layer, a third terminal, and means for coupling the rectifying junction to the third terminal.

4. The memory cell of claim 3 wherein the third terminal is provided on the opposite side of the second layer.

5. The memory cell of claim 1 wherein the source of minority carriers in the first layer comprises regions of the first layer for exposure to photons, the incidence of photons on the said regions generating minority carriers in the first layer.

6. The memory cell of claim 1 wherein the first and second layers are of opposite semiconductor conductivity types.

7. The memory cell of claim 6 wherein the barrier comprises an intrinsic layer.

8. The memory cell of claim 7 wherein the first layer comprises P-type GaAs and the second layer comprises N-type $Al_{0.3}Ga_{0.7}As$.

9. The memory cell of claim 1 and further comprising a third layer having a side adjacent the first layer, the first layer having a side adjacent the second layer and an opposite side, the third layer formed on the side of the first layer opposite the second layer, a barrier between the first and third layers preventing the migration of carriers from the third layer to the first layer, a second source of majority carriers in the first layer, and a drain for majority carriers in the first layer, the second source and drain being positioned generally on opposite sides of the well, the flow of majority carriers between the second source and drain being controlled by the state of the memory cell.

10. The memory cell of claim 5 and further comprising a third layer having a side adjacent the first layer, the first layer having a side adjacent the second layer and an opposite side, the third layer formed on the side of the first layer opposite the second layer, a barrier between the first and third layers preventing the migration of carriers from the third layer to the first layer, a second source of majority carriers in the first layer, and a drain for majority carriers in the first layer, the second source and drain being positioned generally on opposite sides of the well, the flow of majority carriers between the second source and drain being controlled by the state of the memory cell.

* * * * *